United States Patent [19]

Takahashi et al.

[11] Patent Number: 4,837,086
[45] Date of Patent: Jun. 6, 1989

[54] ADHESIVE CLAD INSULATING SUBSTRATE USED FOR PRODUCING PRINTED CIRCUIT BOARDS

[75] Inventors: Hiroshi Takahashi, Kasama; Naohiro Morozumi, Hamamatsu; Shin Takanezawa, Shimodate; Kiyoshi Nakao, Yuki, all of Japan

[73] Assignee: Hitachi Chemical Co., Ltd., Tokyo, Japan

[21] Appl. No.: 824,726

[22] Filed: Jan. 31, 1986

[30] Foreign Application Priority Data

Feb. 4, 1985 [JP] Japan .................................. 60-19624

[51] Int. Cl.$^4$ ...................... B32B 27/08; C08L 61/10
[52] U.S. Cl. ..................................... 428/506; 428/413; 428/331; 428/522; 428/524; 428/460; 428/901; 29/829; 204/30; 260/3; 260/845; 174/259; 427/98
[58] Field of Search .............. 428/506, 522, 901, 524; 260/845, 3

[56] References Cited

U.S. PATENT DOCUMENTS

| | | | |
|---|---|---|---|
| 3,625,758 | 12/1971 | Stahl et al. | 117/212 |
| 4,007,233 | 2/1977 | Kako et al. | |
| 4,029,845 | 6/1977 | Nomura | 428/506 |
| 4,257,926 | 3/1981 | Tanimura et al. | |
| 4,360,560 | 11/1982 | Kopnick et al. | 428/506 |
| 4,457,952 | 7/1984 | Kawamoto et al. | |

FOREIGN PATENT DOCUMENTS

| | | |
|---|---|---|
| 961645 | 4/1957 | Fed. Rep. of Germany . |
| 965596 | 6/1957 | Fed. Rep. of Germany . |
| 2230703 | 5/1974 | France . |
| 260310 | 7/1949 | Sweden . |

Primary Examiner—P. C. Ives
Attorney, Agent, or Firm—Antonelli, Terry & Wands

[57] ABSTRACT

An insulating substrate having a layer of an adhesive composition comprising (A) a modified phenolic resin and (B) acrylonitrile-butadiene rubber on at least one surface of a substrate is suitable for producing printed circuit boards having excellent solder heat resistance by an additive process.

6 Claims, No Drawings

ADHESIVE CLAD INSULATING SUBSTRATE USED FOR PRODUCING PRINTED CIRCUIT BOARDS

BACKGROUND OF THE INVENTION

This invention relates to an adhesive clad insulating substrate used for producing printed circuit boards by an additive process.

Printed circuit boards are produced by an additive process, for example, by the following steps; drilling of through-holes on an insulating substrate coated with an adhesive containing an electroless plating catalyst → chemical roughening of the surface of an adhesive layer → formation of circuits by electroless plating; or drilling of through-holes on an insulating substrate coated with an adhesive containing an electroless plating catalyst → chemical roughening of the surface of an adhesive layer → electroless plating on the whole surface thereof → formation of a resist on portions other than circuits to be formed → electroplating → removal of the resist → removal of plating on portions other than the circuit portions by quick etching; and the like. When a substrate containing no catalyst for electroless plating is used, it is immersed in a solution containing a catalyst for electroless plating in a suitable stage before the electroless plating.

The adhesive in the printed circuit boards produced by the additive process should satisfy the fundamental requirements that it is susceptible to chemical roughening for tightly adhering a metal conductor circuit, that as a result, it is sufficient in bond strength, and that it has excellent heat resistance (solder heat resistance) enough to withstand soldering at a high temperature for loading electronic parts. The surface of a layer of the adhesive should be chemically roughened before the electroless plating. As an adhesive for this purpose, there have generally been proposed adhesives obtained by using as their main constituent a synthetic rubber which is susceptible to chemical roughening and flexible, for example, acrylonitrile-butadiene rubber, crosslinking it by use of an alkylphenol resin in order to keep the heat resistance, and properly mixing therewith an epoxy resin or the like (for instance, U.S. Pat. No. 3,625,758).

However, adhesives for printed circuit boards by additive process used in electronic machines which have been highly developed more and more in recent years have come to be required to be improved in heat resistance.

For example, electronic parts loaded on a printed circuit board by soldering are often replaced because of troubles in the circuit. In such a case, rectification by manual soldering is conducted by using a soldering iron having a temperature usually as high as 300° C. or higher, and in some cases, 400° to 420° C., and the adhesives in the places loaded with soldered parts is softened, so that a circuit is peeled off and tends to be cut. Therefore, replacement of the parts is very difficult. A reason for such insufficiency in heat resistance of the adhesive is as follows. The cross-linking between acrylonitrile-butadiene rubber and phenolic resin is insufficient, and even when an epoxy resin is mixed, it does not react with the acrylonitrile-butadiene rubber and they cure individually, so that the cross-linking of acrylonitrile-butadiene rubber is not improved, resulting in insufficient heat resistance.

SUMMARY OF THE INVENTION

This invention has been made in order to remove the conventional defects described above, and provides an adhesive clad insulating substrate for printed circuit boards produced by an additive process which is excellent in solder heat resistance and soldering iron heat resistance, etc.

This invention provides an insulating substrate having a layer of an adhesive composition comprising (A) a modified phenolic resin produced by addition reacting a p-substituted alkylphenol and at least one of p-phenylphenol and p-cumylphenol with an aldehyde, followed by condensation with a phenol and/or amine having higher reactivity with the aldehyde than the p-substituted alkylphenol and p-phenylphenol and/or p-cumylphenol, and (B) acrylonitrile-butadiene rubber on at least one surface of a substrate.

This invention further provides an adhesive composition comprising (A) a modified phenolic resin produced by addition reacting a p-substituted alkylphenol and at least one of p-phenylphenol and p-cumylphenol with an aldehyde, followed by condensation with a phenol and/or an amine having higher reactivity with the aldehyde than the p-substituted alkylphenol and p-phenylphenol and/or p-cumylphenol, and (B) acrylonitrile-butadiene rubber.

DESCRIPTION OF THE PREFERRED EMBODIMENTS

The p-substituted alkylphenol for producing the modified phenolic resin as the component (A) includes amylphenol, butylphenol, sec-butylphenol, octylphenol, etc.

p-Phenylphenol and/or p-cumylphenol are used in an amount of 0.2 to 0.8 mole per mole of the total phenol components (p-substituted alkylphenol plus at least one of p-phenylphenol and p-cumylphenol). An aldehyde (formaldehyde, acetaldehyde or the like) is addition reacted with the phenols in an amount of 1.3 moles or more per mole of the total phenol components in the presence of a basic catalyst. A phenol or an amine having higher reactivity with the aldehyde than the p-substituted alkylphenol and p-phenylphenol and/or p-cumylphenol is added to thus obtained addition reaction intermediate product in an amount of preferably 0.2 to 15 parts by weight per 100 parts by weight of intermediate product, and is condensed with said intermediate product to obtain the modified phenolic resin of this invention.

The phenol having higher reactivity with the aldehyde includes resorcin, catechol, meta-cresol, phenol, etc. As the amine, there can be used melamine, benzoguanamine, acetoguanamine, tetramethylenehexamine, urea, etc.

A reason why the amount of the phenol and/or amine added is preferably 0.2 to 15 parts by weight per 100 parts by weight of the intermediate product is that when it is less than 0.2 part by weight, sufficient exhibition of the heat resistance of adhesive which is the object of this invention tends to be impossible, while when it exceeds 15 parts by weight, the miscibility with the acrylonitrile-butadiene rubber used as an adhesive tends to be lowered.

The acrylonitrile-butadiene rubber is a copolymer of acrylonitrile and butadiene, or a copolymer obtained by copolymerizing therewith at least one of other copolymerizable monomers such as acrylic acid or the like. Although the acrylonitrile content is not critical, it is preferably 19% by weight or more when a commercially available one is used.

In the adhesive composition, the compounding ratio of the aforesaid modified phenolic resin (A) to the acrylonitrile-butadiene rubber (B) is preferably in the range of 70/30 to 7/93, more preferably 50/50 to 15/85 in solid weight ratio.

As to the compounding ratio of the modified phenolic resin (A) to the acrylonitrile-butadiene rubber (B), when the proportion of the modified phenolic resin exceeds 70% by weight, no sufficient bond strength to electroless plating metal layer can be attained, while when it is less than 7% by weight, the heat resistance, in particular, soldering iron heat resistance is lowered. Although the adhesive composition fundamentally comprises the constituents described above, epoxy resins and the like are useful for improving nonstickiness and chemical resistance and can be properly used.

In this invention, a catalyst for electroless plating which becomes a nucleus for electroless plating can be incorporated into the adhesive. As the catalyst for electroless plating, there can be used salts or oxides of metals in groups 8, 1B and 2B of the periodic table. For example, compounds of platinum, palladium, tin and the like are used. They can be incorporated into the adhesive in the form of solid particles, a solution of them alone in an organic solvent, or a solution prepared by dissolving and dispersing them together with other resins, for example, an epoxy resin in an organic solvent. The amount of the catalyst contained in the adhesive in terms of the above-mentioned noble metal compounds ranges from 0.001 to 2.5% by weight, preferably 0.01 to 0.5% by weight based on the weight of solids in the adhesive. Inorganic fillers readily form unevenness of the surface in the step of chemical roughening and hence can improve the adhesive properties. They can be properly incorporated, and there can be used, for example, finely powdered silica, zirconium silicate, magnesium silicate, titanium dioxide, calcium carbonate, zinc oxide, etc.

The above-mentioned components of the adhesive are kneaded and mixed in an organic solvent to prepare a mixture in the form of a solution. As the organic solvent, there can be used at least one member selected from the group consisting of toluene, methyl ethyl ketone, acetone, methyl isobutyl ketone, xylene, diethylene glycol monomethyl ether, diethylene glycol monoethyl ether, diethylene glycol monoethyl ether acetate, ethyl acetate, etc.

As an insulating substrate, there can be used laminates obtained by using a phenolic resin or epoxy resin, or sheets made from inorganic or organic materials. The adhesive clad insulating substrate of this invention is produced by coating the above-mentioned adhesive solution on such a substrate and drying the same by heating at a temperature of about 120° to about 190° C. As to the thickness of the adhesive coating film, the adhesive solution is coated to a thickness of about 10 to about 50 μm.

In depositing an electroless plating metal layer, the surface of the adhesive film is chemically roughened to give a shape suitable for adhesion, and when a catalyst for electroless plating is contained, it is exposed on the surface by the chemical roughening.

As a treating solution used for the chemical roughening, there can be used conventional chromic acid-sulfuric acid, dichromate-sulfuric acid, etc. As an electroless plating bath, there can be used conventional one.

Drilling for providing a printed circuit board with holes for loading electronic parts or through-holes is conducted by means of a punch press or an NC drilling machine. Formation of a resist pattern is usually conducted by screen printing or photographic printing of a plating resist ink, and printing of the resist is conducted in a step before or after the chemical roughening treatment.

This invention is illustrated below in detail by way of Examples, in which all parts and percents are by weight unless otherwise specified.

EXAMPLE 1

With 75 g (0.5 mole) of p-tert-butylphenol and 85 g (0.5 mole) of p-phenylphenol were reacted 162 g (2 moles) of formaldehyde and 1 g (0.025 mole) of sodium hydroxide with heating at 98° to 100° C. for 3 hours, after which the reaction mixture was neutralized by adding 10.5 g (0.1 mole) of hydrochloric acid and then washed with water. With the reaction product thus obtained was condensed 8 g (5 parts per 100 parts of the intermediate product) of resorcin to obtain a modified phenolic resin having a softening point of 120° C.

An adhesive was prepared by kneading and dissolving 100 parts of the aforesaid modified phenolic resin, 200 parts of acrylonitrile-butadiene rubber (acrylonitrile content: 41%), 60 parts of silica and 0.3 part of palladium chloride in a mixed solvent of Cellosolve acetate and methyl ethyl ketone in a ratio of 1:1 by weight by means of a kneader so as to adjust the solid content to 23%. The adhesive was coated on both sides of a phenolic paper-base laminate (LP-141, a trade name, mfd. by Hitachi Chemical Company, Ltd.) or an epoxy paper-base laminate (LE-144, a trade name, mfd. by Hitachi Chemical Company, Ltd.) both 500 mm square by immersing each laminated sheet in the adhesive, so as to adjust the film thickness of the adhesive after drying to 25 μm, and then dried by heating at 160° C. for 60 minutes to obtain an adhesive clad insulating substrate.

Subsequently, the adhesive clad insulating substrate was provided with through-holes having a diameter of 1 mm by punching, immersed in a chromic acid mixture (prepared by diluting 55 g of $CrO_3$ and 210 ml of concentrated sulfuric acid with water to a total volume of 1 liter) at 40° C. for 15 minutes to carry out chemical roughening treatment, and then washed with water. Next, electroless plating was conducted at 67° C. for 30 hours.

As an electroless plating solution, a solution having the following composition was used:

| | |
|---|---|
| $CuSO_4.5H_2O$ | 0.03 mole/liter |
| Sodium hydroxide | 0.125 mole/liter |
| Sodium cyanide | 0.0004 mole/liter |
| Formalin (formaldehyde solution) | 0.08 mole/liter |
| Sodium ethylenediaminetetraacetate | 0.036 mole/liter |

The thickness of the copper layer thus obtained was 35 μm. The plated product was washed with water and then dried by heating at 160° C. for 60 minutes.

The results of a heat resistance test on the dried plated product are shown in Table 1.

Referential Example 1

With 150 g (1 mole) of p-tert-butylphenol were reacted 162 g (2 moles) of formaldehyde and 1 g (0.025 mole) of sodium hydroxide with heating at 98° to 100° C. for 3 hours, after which the reaction mixture was neutralized by adding 10.5 g (0.1 mole) of hydrochloric acid, and then washed with water. While heating the washed reaction mixture, the water was removed therefrom, and the reaction was allowed to proceed at 130° C. to obtain a phenolic resin having a softening point of 110° C.

An adhesive was prepared in the same manner as in Example 1, except that 100 parts of the aforesaid phenolic resin was used, and electroless plating was conducted. The results of the heat resistance test on the plated product thus obtained are shown in Table 1.

EXAMPLE 2

With 82 g (0.5 mole) of p-tert-amylphenol was mixed 85 g (0.5 mole) of p-phenylphenol, followed by adding thereto 75 g (2 moles) of paraformaldehyde, 4 g (0.1 mole) of sodium hydroxide and 100 g of toluene. The resulting mixture was subjected to reaction at 90° C. for about 2 hours, neutralized by adding 15 g of acetic acid, and then washed with water.

Thereafter, while removing the solvent, the washed mixture was subjected to reaction at 120° C., and the reaction product thus obtained was condensed with 1.6 g (1 part per 100 parts of the intermediate product) of resorcin to obtain a modified phenolic resin having a softening point of 105° C.

Subsequently, in the same manner as in Example 1, an adhesive was prepared and electroless plating was conducted. The results of the heat resistance test on the plated product thus obtained are shown in Table 1.

Referential Example 2

An adhesive was prepared in the same manner as in Example 2, except that p-tert-amylphenol alone was used in place of the phenol components used in Example 2 and that no condensation with resorcin was carried out, and electroless plating was conducted. The results of the heat resistance test on the plated product thus obtained are shown in Table 1.

EXAMPLE 3

With 120 g (0.8 mole) of p-tert-butylphenol were mixed 42.4 g (0.2 mole) of p-cumylphenol, 68.5 g (1.8 moles) of paraformaldehyde, 12.5 g (0.04 mole) of barium hydroxide and 70 g of benzene, and the resulting mixture was subjected to reaction at 75° to 80° C. for 5 hours. Then, the reaction mixture was neutralized by adding 21 g of hydrochloric acid, and washed with water. To the washed reaction mixture was added 4.86 g (3 parts per 100 parts of the intermediate product) of resorcin, after which dehydration and removal of the solvent were carried out and the reaction was allowed to proceed at 120° to 130° C. to obtain a modified phenolic resin having a softening point of 113° C.

As an adhesive, there was used a composition consisting of 100 parts of the aforesaid modified phenolic resin, 250 parts of acrylonitrile-butadiene rubber, 30 parts of bisphenol type epoxy resin, 5 parts of imidazole series curing agent, 80 parts of titanium dioxide and 0.2 part of palladium chloride. By use of this adhesive, electroless plating was conducted in the same manner as in Example 1. The results of the heat resistance test on the plated product thus obtained are shown in Table 1.

EXAMPLE 4

With 75 g (0.5 mole) of p-tert-butylphenol and 85 g (0.5 mole) of p-phenylphenol were reacted 162 g (2 moles) of formaldehyde and 1 g (0.025 mole) of sodium hydroxide with heating at 98° to 100° C. for 3 hours, after which the reaction mixture was neutralized by adding 10.5 g (0.1 mole) of hydrochloric acid, and then washed with water. With the reaction product thus obtained was condensed 8 g (5 parts per 100 parts of the intermediate product) of melamine to obtain a modified resin. Subsequently, in the same manner as in Example 1, an adhesive was prepared and electroless plating was conducted. The results of the heat resistance test on the plated product thus obtained are shown in Table 1.

Referential Example 3

Electroless plating was conducted in the same manner as in Example 3, except that p-tert-butylphenol alone was used in place of the phenol components used in Example 3 and that no condensation with resorcin was carried out. The results of the heat resistance test on the plated product thus obtained are shown in Table 1.

TABLE 1

| | Characteristics | | | |
|---|---|---|---|---|
| | Solder heat resistance[*1] | | Soldering iron heat resistance[*2] | |
| | Laminated Sheet | | | |
| Adhesive | Phenolic paper-base LP-141 | Epoxy paper-base LE-144 | Phenolic paper-base LP-141 | Epoxy paper-base LE-144 |
| Example 1 | 40 sec. | 90 sec. | 3 times | 5 times |
| Example 2 | 38 | 80 | 3 | 5 |
| Example 3 | 45 | 100 | 3 | 5 |
| Example 4 | 35 | 80 | 3 | 4 |
| Referential Example 1 | 15 | 28 | 0 | 1 |
| Referential Example 2 | 10 | 25 | 0 | 1 |
| Referential Example 3 | 17 | 33 | 0 | 1 |

Measurement method:

(1) According to JIS C-6481. Seconds required for destruction in a soldering bath at 260° C.

(2) An electronic part loaded on a through-hole portion was connected by soldering with a flow solder adjusted to 260° C. Then, the solder was removed by means of a solder removing device adjusted to 280° C., and the electronic part was replaced by another one, followed by connection by soldering by means of a soldering iron adjusted to 420° C. The above-mentioned replacement of the part by means of the solder removing device and the connection by means of the soldering iron were repeated and the number of repetitions until severance of the connection such as destruction of circuit of the through-hole portion was counted.

When a printed circuit board was produced by use of the laminated sheet with adhesive of this invention by an additive process, there was obtained a printed circuit board excellent in heat resistance, in particular, solder heat resistance and soldering iron heat resistance.

What is claimed:

1. An insulating substrate having a layer of an adhesive composition comprising (A) a modified phenolic resin produced by addition reacting a p-substituted alkylphenol and at least one of p-phenylphenol and p-cumylphenol with an aldehyde, followed by condensation with a phenol and/or an amine having higher reactivity with the aldehyde than the p-substituted alkylphenol and p-phenylphenol and/or p-cumylphenol, the p-substituted alkylphenol being present in an amount of 0.2 to 0.8 mole per mole of the total phenol components, the aldehyde being reacted in an amount of at least 1.3 moles per mole of the total phenol components in the presence of a basic catalyst and a phenol and/or amine being added to the thus-obtained addition reaction intermediate product in an amount of 0.2 to 15 parts by weight per 100 parts by weight of the intermediate product and being condensed with said intermediate product to provide said modified phenolic resin and (B) acrylonitrile-butadiene rubber on at least one surface of a substrate; the ratio of the component (A) to component (B) being 70/30 to 15/85 in solid weight ratio.

2. An insulating substrate according to claim 1, wherein the p-substituted alkylphenol is amylphenol, butylphenol, sec-butylphenol, or octylphenol.

3. An insulating substrate according to claim 2, wherein the phenol having a higher reactivity with an aldehyde is resorcin, catechol, meta-cresol or phenol.

4. An insulating substrate according to claim 3, wherein the amine having a higher reactivity with an aldehyde is melamine, benzoguanamine, acetoguanamine, tetramethylenehexamine, or urea.

5. An insulating substrate according to claim 1, wherein said adhesive composition contains a catalyst for electroless plating, said catalyst comprising a compound of platinum, palladium or tin and being present in terms of said metal compounds in an amount ranging from 0.01 to 2.5% by weight based on the weight of solids in the adhesive.

6. An insulating substrate according to claim 1, wherein the ratio of component (A) to component (B) is 50/50 to 15/85 in solid weight ratio.

* * * * *